(12) United States Patent
Chun et al.

(10) Patent No.: US 9,507,675 B2
(45) Date of Patent: Nov. 29, 2016

(54) SYSTEMS AND METHODS FOR RECOVERING FROM UNCORRECTED DRAM BIT ERRORS

(71) Applicant: QUALCOMM INCORPORATED, San Diego, CA (US)

(72) Inventors: Dexter Tamio Chun, San Diego, CA (US); Yanru Li, San Diego, CA (US); Jung Pill Kim, San Diego, CA (US); Deepti Vijayalakshmi Sriramagiri, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 220 days.

(21) Appl. No.: 14/253,770

(22) Filed: Apr. 15, 2014

(65) Prior Publication Data

US 2015/0293822 A1    Oct. 15, 2015

(51) Int. Cl.
*G06F 11/20* (2006.01)
*G06F 11/10* (2006.01)
(Continued)

(52) U.S. Cl.
CPC ......... *G06F 11/2017* (2013.01); *G06F 3/0688* (2013.01); *G06F 11/0772* (2013.01); *G06F 11/08* (2013.01); *G06F 11/1008* (2013.01); *G06F 11/1016* (2013.01); *G06F 11/1048* (2013.01); *G06F 11/1417* (2013.01); *G11C 29/00* (2013.01); *G11C 29/08* (2013.01);
(Continued)

(58) Field of Classification Search
CPC .......... G06F 11/1048; G06F 11/1417; G06F 11/2017; G06F 2201/85; G06F 2212/7201; G06F 11/1008; G06F 11/0772; G06F 11/08; G06F 11/1016; G06F 3/0688; G06F 2212/1032; G11C 29/00; G11C 29/08; G11C 29/52; G11C 29/70
USPC ........... 714/763, 718, 6.1, 766, 764, E11.03, 714/E11.034, 15, 6.12, 6.13, 42; 707/674, 707/813
See application file for complete search history.

(56) References Cited

U.S. PATENT DOCUMENTS 7,216,258 B2    5/2007 Ebsen et al.
7,424,666 B2    9/2008 Chandwani et al.
(Continued)

FOREIGN PATENT DOCUMENTS

WO    9512848 A1    5/1995

OTHER PUBLICATIONS

Hwang et al., Cosmic Rays Don't Strike Twice: Understanding the Nature of DRAM Errors and the Implications for System Design, Mar. 3-7, 2012, ASPLOS'12, pp. 1-12.*
(Continued)

*Primary Examiner* — John J Tabone, Jr.
(74) *Attorney, Agent, or Firm* — Smith Tempel

(57) ABSTRACT

Systems, methods, and computer programs are disclosed for recovering from dynamic random access memory (DRAM) defects. One method comprises determining that an uncorrected bit error has occurred for a physical codeword address associated with a dynamic random access memory (DRAM) device coupled to a system on chip (SoC). A kernel page associated with a DRAM page comprising the physical codeword address is identified as a bad page. Recovery from the uncorrected bit error is provided by rebooting a system comprising the SoC and the DRAM device. In response to the rebooting, the identified kernel page is excluded from being allocated for DRAM operation.

36 Claims, 9 Drawing Sheets

(51) Int. Cl.
*G06F 11/14* (2006.01)
*G06F 11/07* (2006.01)
*G06F 11/08* (2006.01)
*G11C 29/00* (2006.01)
*G11C 29/52* (2006.01)
*G06F 3/06* (2006.01)
*G11C 29/08* (2006.01)

(52) U.S. Cl.
CPC ............... *G11C29/52* (2013.01); *G11C 29/70* (2013.01); *G06F 2201/85* (2013.01); *G06F 2212/1032* (2013.01); *G06F 2212/7201* (2013.01)

(56) References Cited

U.S. PATENT DOCUMENTS

| | | | | |
|---|---|---|---|---|
| 8,671,309 B2* | 3/2014 | Raj | .................... | G06F 11/0715 714/10 |
| 8,719,664 B1* | 5/2014 | Chan | .................. | G06F 11/1076 711/103 |
| 8,812,816 B2* | 8/2014 | Post | ............................. | 707/674 |
| 8,924,832 B1* | 12/2014 | Lam | ....................... | G06F 12/06 702/117 |
| 9,003,223 B2* | 4/2015 | Ackaret | ............. | G06F 12/0653 714/6.1 |
| 9,208,020 B2* | 12/2015 | Lam | ....................... | G06F 12/06 |
| 2007/0043975 A1 | 2/2007 | Varadarajan et al. | | |
| 2007/0061612 A1 | 3/2007 | Henderson et al. | | |
| 2008/0320214 A1* | 12/2008 | Ma | ........................ | G06F 3/0613 711/103 |
| 2009/0144579 A1* | 6/2009 | Swanson | ............. | G06F 11/0712 714/3 |
| 2011/0047440 A1 | 2/2011 | Blackmon et al. | | |
| 2011/0238886 A1* | 9/2011 | Post | .................... | G06F 12/0246 711/103 |
| 2013/0036276 A1 | 2/2013 | Radovic et al. | | |
| 2013/0111301 A1* | 5/2013 | Chu | .................... | G06F 11/1008 714/766 |
| 2014/0089725 A1* | 3/2014 | Ackaret | ............. | G06F 12/0653 714/6.1 |
| 2014/0189427 A1* | 7/2014 | Jayaprakash Bharadwaj | .......... | G06F 11/1412 714/15 |
| 2014/0289559 A1* | 9/2014 | Hashimoto | ............ | G11C 29/08 714/27 |
| 2015/0089280 A1* | 3/2015 | Sade | .................... | G06F 11/073 714/6.12 |

OTHER PUBLICATIONS

International Search Report and Written Opinion—PCT/US2015/025798—ISA/EPO—Jul. 1, 2015.

* cited by examiner

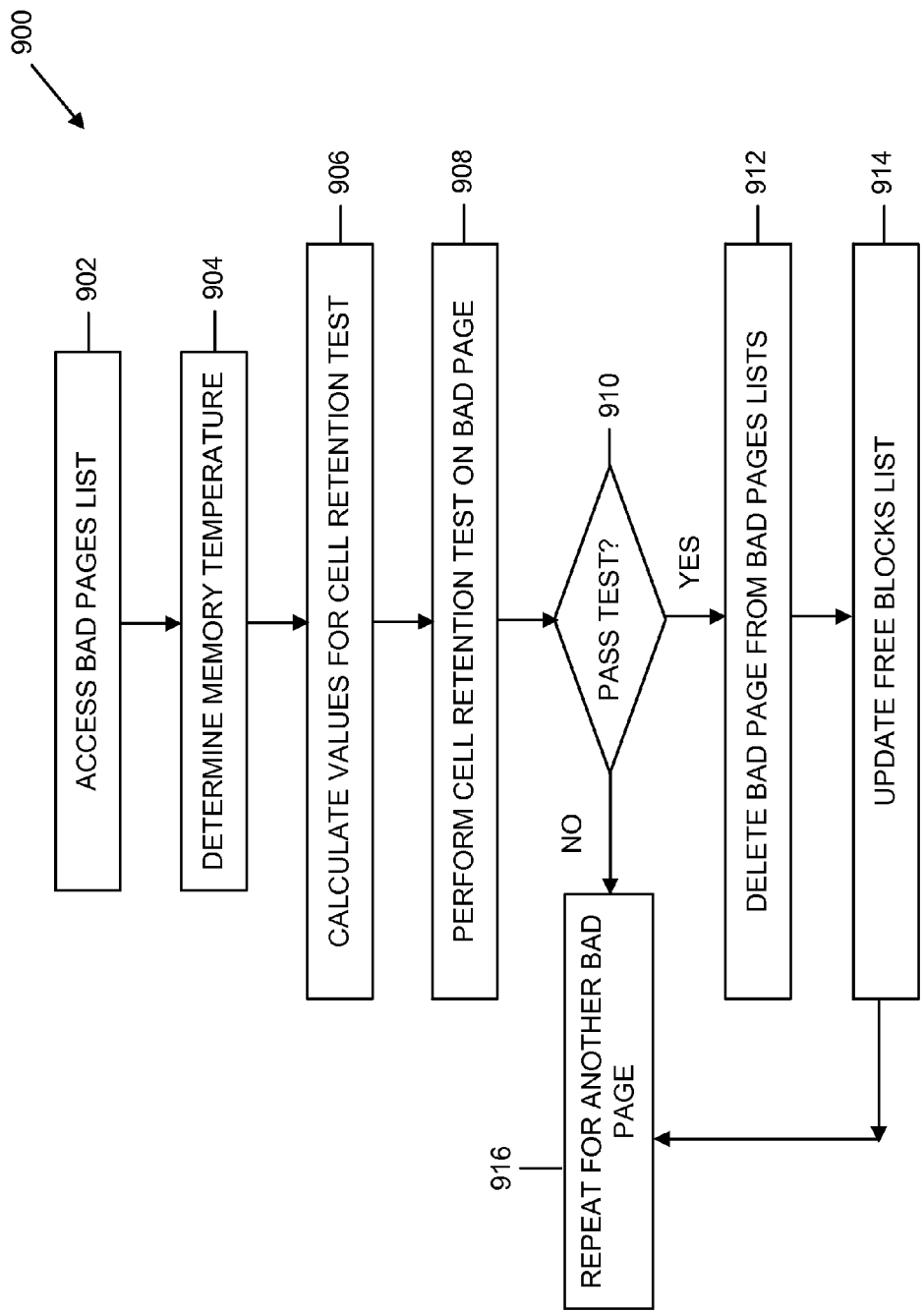

SYSTEMS AND METHODS FOR RECOVERING FROM UNCORRECTED DRAM BIT ERRORS

DESCRIPTION OF THE RELATED ART

Dynamic random access memory (DRAM) manufacturing process technology continues to scale down to accommodate increasing demands for greater memory capacity in smaller chips. The common measure of DRAM process technology is half-pitch, which refers to half the distance between cells in a DRAM chip. Current DRAM process technology produces DRAM chips with a half-pitch in the range of 20-30 nanometer (nm), although it is expected that improvements in process technology will scale down to less than 20 nm in the near future.

While denser DRAM chips provide desirable performance and design advantages, the shrinking geometry produces many challenges. For example, as DRAM process technology continues to scale down, there will be a proportionate decrease in cell capacitance, which increases cell transistor leakage. The probability for DRAM bit failures due to weak cells or other failure mechanisms may increase. There is the possibility for multiple bit errors to occur within a single burst read operation. When this occurs, there is a risk of exceeding the error correcting code (ECC) strength built into the DRAM system, resulting in uncorrected DRAM bit errors that may cause system failure. While increasing the ECC strength may reduce otherwise uncorrected bit errors, this comes at the expense of increased manufacturing costs and increased die area. For instance, an ECC that can correct 1-bit in 256-bits needs about 4% die area increase. An ECC that can correct 2-bit in 256-bits needs about 7% die area increase. Therefore, it may be desirable to minimize the area cost of the ECC and provide alternative mechanisms for addressing uncorrected DRAM bit errors.

Accordingly, there is a need for improved systems and methods for recovering the system after uncorrected bit error(s) from the DRAM and eliminating further use of the failed portion of DRAM.

SUMMARY OF THE DISCLOSURE

Systems, methods, and computer programs are disclosed for recovering from uncorrected DRAM bit errors. One method comprises: determining that an uncorrected bit error has occurred for a physical codeword address associated with a dynamic random access memory (DRAM) device coupled to a system on chip (SoC); identifying a kernel page associated with a DRAM page comprising the physical codeword address as a bad page; and recovering from the uncorrected bit error by rebooting a system comprising the SoC and the DRAM device and, in response to the rebooting, excluding the identified kernel page from being allocated for DRAM operation.

Another embodiment is a system for recovering from dynamic random access memory (DRAM) defects. One such system comprises a dynamic random access memory (DRAM) system and a system on chip (SoC). The DRAM system comprises an error correcting code (ECC) module for detecting and correcting bit errors associated with failed physical codeword addresses in the DRAM system. The SoC is coupled to the DRAM system and comprises a DRAM controller, a memory device, and a central processing unit (CPU). The CPU executes a recovery module from the memory device in response to an uncorrected bit error that cannot be corrected by the ECC module. The recovery module comprises logic configured to: determine that the uncorrected bit error has occurred for a physical codeword address associated with the DRAM system; identify a kernel page associated with a DRAM page comprising the physical codeword address as a bad page; and initiate a reboot of a system comprising the SoC and the DRAM device and, in response to the reboot, exclude the identified kernel page from being allocated for DRAM operation.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 9 is a flowchart illustrating an embodiment of a method for testing and reactivating failed DRAM pages.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
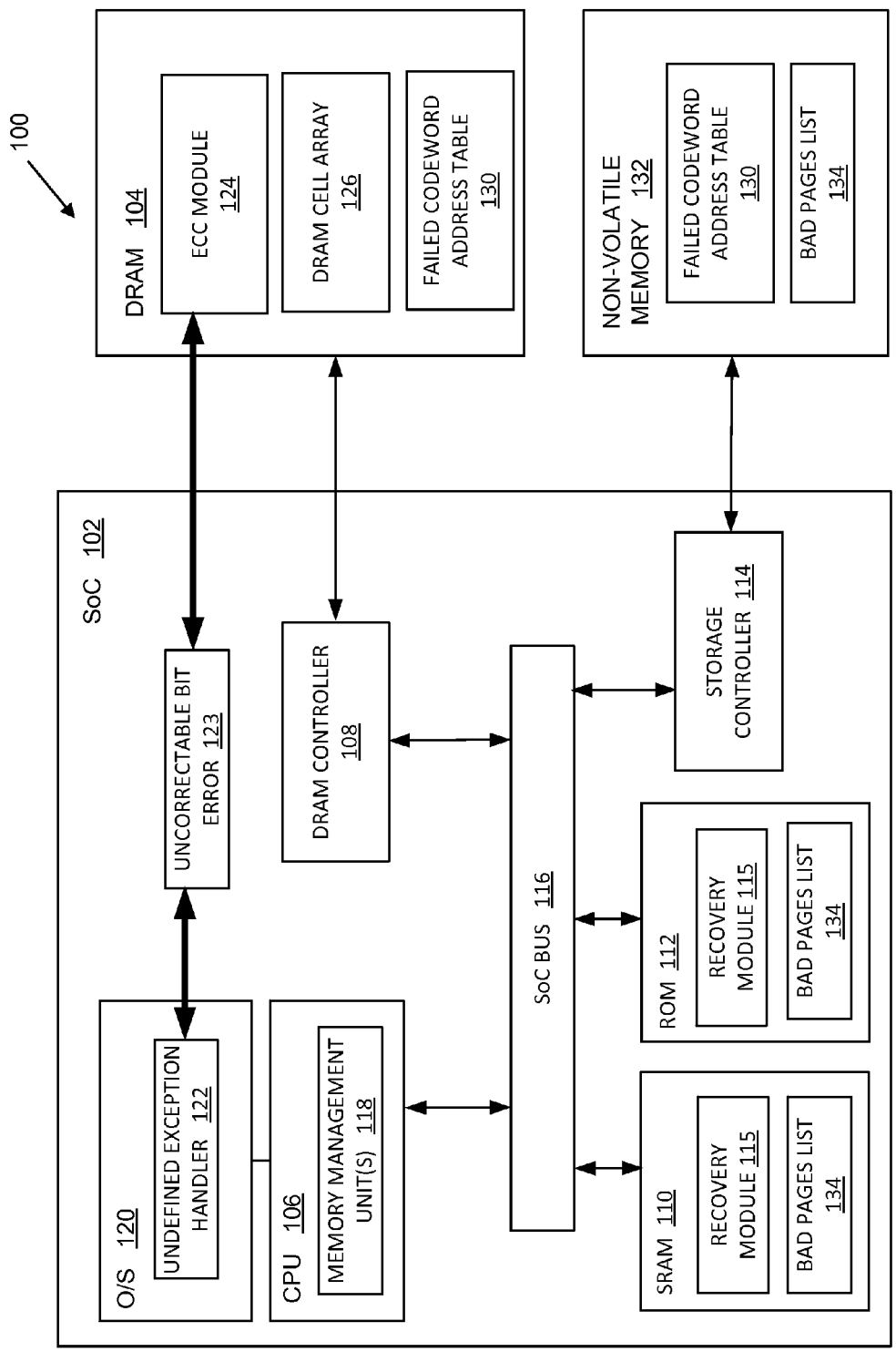
FIG. 1 is a block diagram of an embodiment of a system for recovering from uncorrected DRAM bit errors.

FIG. 1 illustrates a system 100 for recovering from uncorrected bit error(s) in a dynamic memory access memory (DRAM) 104. An uncorrected DRAM bit error refers to an operational condition of the DRAM 104 in which error correcting code (ECC) (e.g., ECC module 124) is unable to correct one or more bit errors during a normal read operation. The system 100 may be implemented in any computing device, including a personal computer, a workstation, a server, a portable computing device (PCD), such as a cellular telephone, a portable digital assistant (PDA), a portable game console, a palmtop computer, or a tablet computer. As illustrated in the embodiment of FIG. 1, the system 100 comprises a system on chip (SoC) 102 electrically coupled to a DRAM memory system 104 and a non-volatile memory 132. The non-volatile memory 132 may comprise any non-volatile memory, such as, for example, flash memory, flash drive, a Secure Digital (SD) card, a solid-state drive (SSD), or other types.

The SoC 102 comprises various on-chip components, including a central processing unit (CPU) 106, a DRAM controller 108, static random access memory (SRAM) 110, read only memory (ROM) 112, and a storage controller 114 interconnected via a SoC bus 116. The SoC 102 may include one or more memory clients that request memory resources from DRAM 104. The memory clients may comprise one or more processing units (e.g., central processing unit (CPU) 106, a graphics processing unit (GPU), a digital signal processor (DSP), etc.), a video encoder, or other clients requesting read/write access to DRAM system 104.

Storage controller 114 on SoC 102 is electrically coupled to non-volatile memory 132. Storage controller 114 manages the data stored on non-volatile memory 132. DRAM controller 108 is electrically coupled to DRAM 104 via, for example, a RAM bus. DRAM controller 108 manages the flow of data going to and from the DRAM 104. DRAM controller 108 generally comprises the logic for reading and writing to DRAM 104.

As illustrated in FIG. 1, the ECC module 124 may encounter an uncorrected bit error 123 during operation of the DRAM 104. ECC module 124 is configured to detect and correct single-bit or double-bit errors during DRAM operations (e.g., read and/or write operations). For example, during a DRAM write operation, the ECC module 124 may use the write data as input and then generate redundant parity check bits. The combined write data and parity check bits together form a unit known as a codeword and may be stored either separated or together in the DRAM cell array 126. During a read operation, the ECC module 124 may use the retrieved data portion of the codeword to recompute the parity check bits and then compare these against the parity check bits portion of the codeword that was stored during the write operation. A mismatch between the read recomputed parity and the stored parity indicates a detected error. In addition, the parity check bits may be sufficient to provide single error correction within the codeword.

As mentioned above, as DRAM process technology continues to scale down (e.g., approaching 20 nm and below), there may be a proportionate decrease in cell capacitance, which increases cell transistor leakage and increases the probability of DRAM bit failures. There is the possibility for multiple bit errors to occur within a single burst read operation. When this occurs, there is a risk of exceeding the error correcting code (ECC) strength built into the DRAM system, resulting in uncorrected DRAM bit errors that may cause system failure. It should be appreciated that the strength of the ECC module 124 may vary and, therefore, the likelihood of uncorrected DRAM bit errors occurring in the system 100 may also vary. In an embodiment, the ECC module 124 may be able to detect and correct 1-bit or 2-bit errors for a physical codeword address (e.g., 256-bit codeword).

One of ordinary skill in the art will appreciate that the DRAM bit errors may have several underlying causes, such as, for example, latent silicon defect, particle or electromagnetic wave disruption of charge, or weak capacitor retention, any of which may result in a codeword error.

As illustrated in FIG. 1, the system 100 comprises recovery module(s) 115 stored in SRAM 110 and/or ROM 112 on the SoC 102. Recovery module(s) 115 comprise logic responsive to the occurrence of an uncorrected DRAM bit error 123 for implementing a recovery process to avoid system failure. The recovery module(s) 115 allow an operating system (O/S) 120 to mask out defects or errors in the DRAM cell array 126 and, thereby, provide error-free virtual memory to the memory clients on the SoC 102. In operation, when an uncorrected bit error 123 occurs, the CPU 106 may receive incorrect instruction(s) and/or data. For example, an incorrectly decoded instruction or a bad address may cause the O/S 120 to branch to an undefined exception handler 122, which comprises recovery module(s) 115 running from ROM 112 and/or SRAM 110 on the SoC 102.

Figure 2:
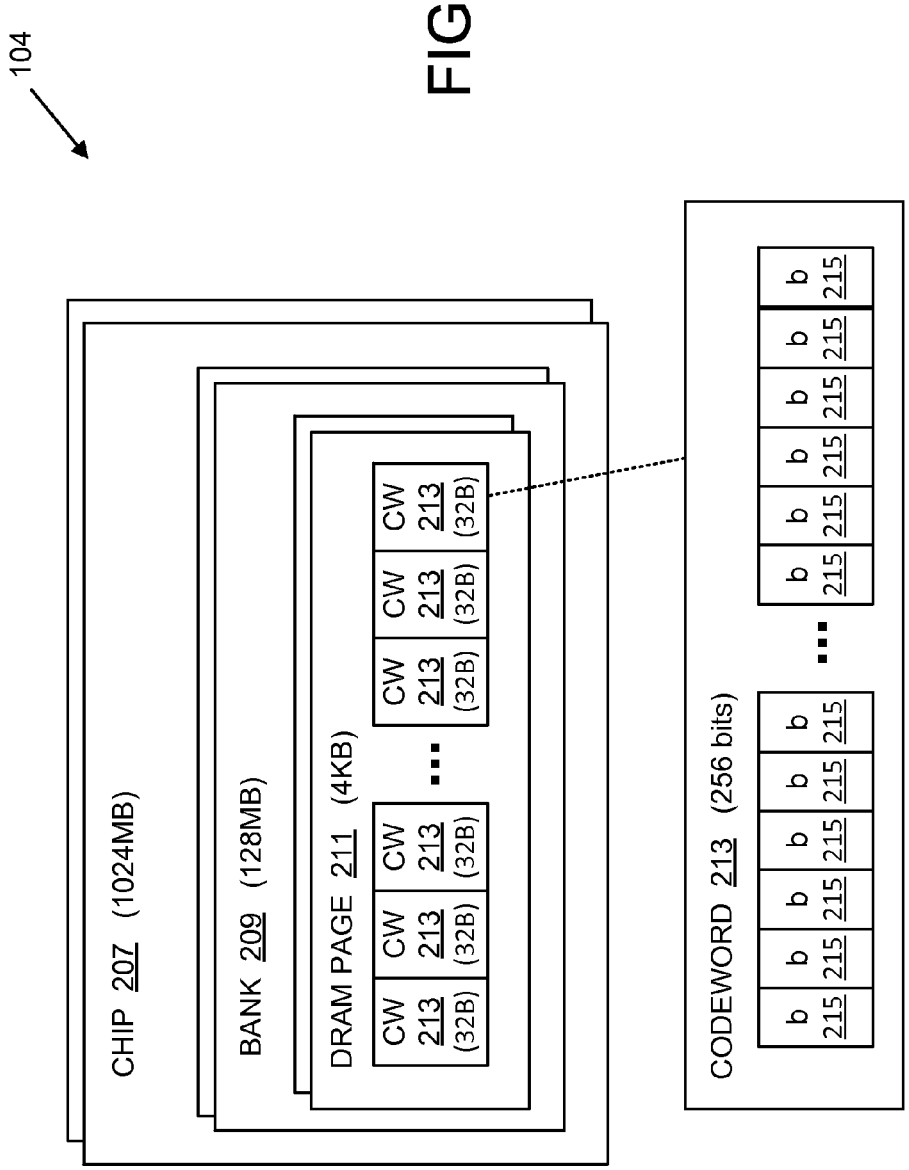
FIG. 2 is a block diagram illustrating a more detailed view of the physical architecture of an embodiment of the DRAM system in FIG. 1.
Figure 4:
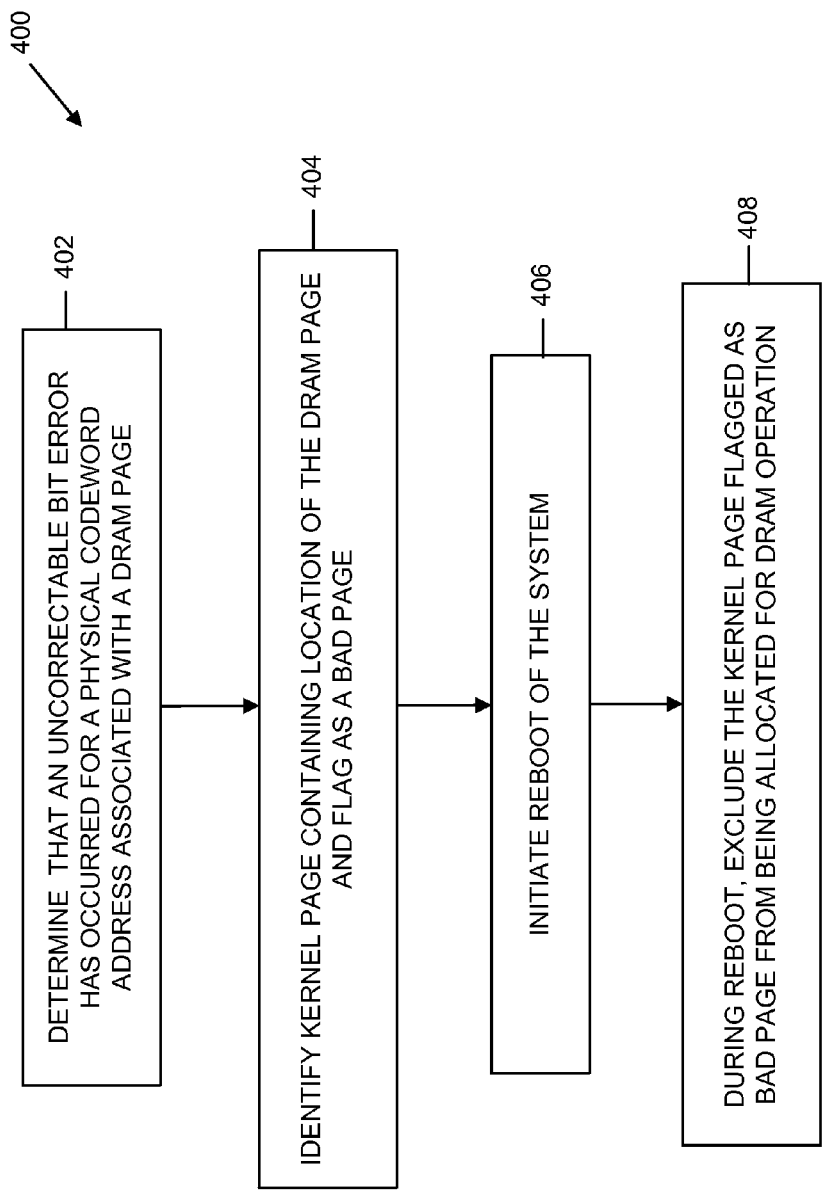
FIG. 4 is a flowchart illustrating the architecture, operation, and/or functionality of an embodiment of the recovery module(s) in the system of FIG. 1 and a related method for recovering from uncorrected DRAM bit errors.

FIG. 4 illustrates an embodiment of a method 400 implemented in the system 100 for recovering from an uncorrected bit error 123. At block 402, the system 100 determines that an uncorrected bit error 123 has occurred for a physical codeword address associated with a DRAM page 211. FIG. 2 illustrates an exemplary embodiment of a DRAM system 104, which comprises one or more DRAM chips 207. As known in the art, each DRAM chip 207 may comprise a plurality of banks 209 with each bank 209 defining a plurality of DRAM pages 211. A DRAM page 211 comprises a plurality of codewords 213. A codeword 213 comprises a plurality of bits 215 in DRAM cell array 126. FIG. 2 shows a codeword 213 comprising 256 bits of data and corresponding to a physical codeword address (0x00000DAD0). If the ECC module 124 is unable to correct bit error(s) associated with the physical codeword address, an uncorrected bit error 123 is determined to have occurred.

The ECC module 124 may store error data associated with the uncorrected bit error 123 in, for example, a volatile register (RAM) inside the DRAM 104, which can be read by the recovery module(s) 115. In an embodiment, the error data comprises data identifying the physical codeword address associated with the failed DRAM page 211 (e.g., the failing bank 209 and column and row addresses). The DRAM controller 108 may receive notification from the ECC module 124 of the uncorrected bit error 123.

Figure 3:
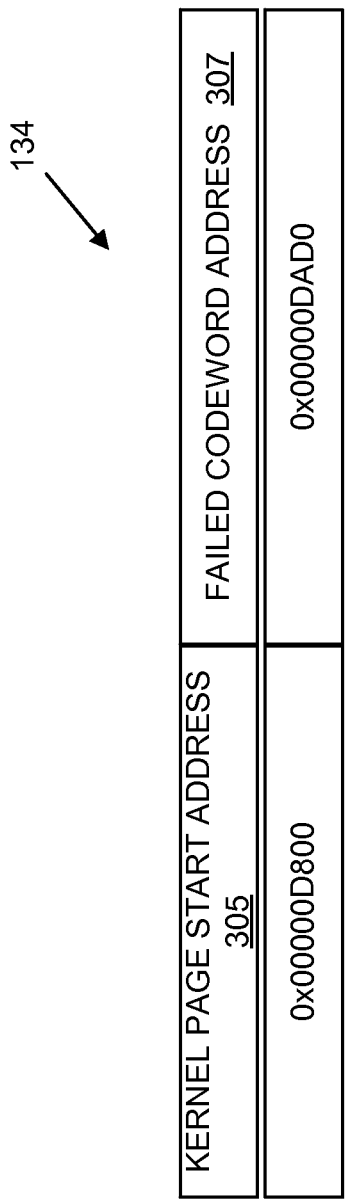
FIG. 3 is a data diagram illustrating an embodiment of a bad pages list for implementing certain aspects of a method for recovering from uncorrected DRAM bit errors in the system of FIG. 1.

Referring again to FIG. 4, at block 404, the recovery module(s) 115 may identify in response to the uncorrected bit error 123 a kernel page containing the location of the failed DRAM page 211. The kernel page is flagged as a bad page to be retired from further use by the system 100. It should be appreciated that kernel pages may be retired via the generation and management of a bad pages list 134 stored in non-volatile memory 132, SRAM 110, and/or ROM 112. FIG. 3 illustrates an exemplary bad pages list 134, which identifies a kernel page start address (data field 305) containing the failed codeword address (field 307) corresponding to the uncorrected bit error 123. In the example of FIG. 3, the physical codeword address 0x00000DAD0 is identified as a failed codeword address. Bad pages list 134 may be updated to list the kernel page start address (0x00000D800) in data field 305 that holds the failed codeword address (0x00000DAD0).

As described below in more detail, when assigning physical pages to virtual memory, system 100 may access the bad pages list 134 to determine which pages resulted in uncorrected bit errors and exclude them from being allocated. Access to physical pages may be controlled from the operating system 120 using the same free page block lists, page tables, and MMU 118 as used for regular virtual-to-physical mapping. Kernel page start addresses 305 that have been found to be bad are removed from the operating system's free page block list. In this manner, virtual memory is never allocated using bad physical pages as defined in bad pages list 134.

At block 406, the recover module(s) 115 initiate a reboot or restart of the system 100 while preserving the bad pages list 134 SRAM 110. During the restart, the CPU 106 uses the data preserved in SRAM 110 to update a nonvolatile table containing the complete list of bad pages stored in non-volatile memory 132. The O/S 120 is provided the table of bad pages. At block 408, the kernel page flagged as a bad page is excluded from being allocated for DRAM operation.

Figure 5:
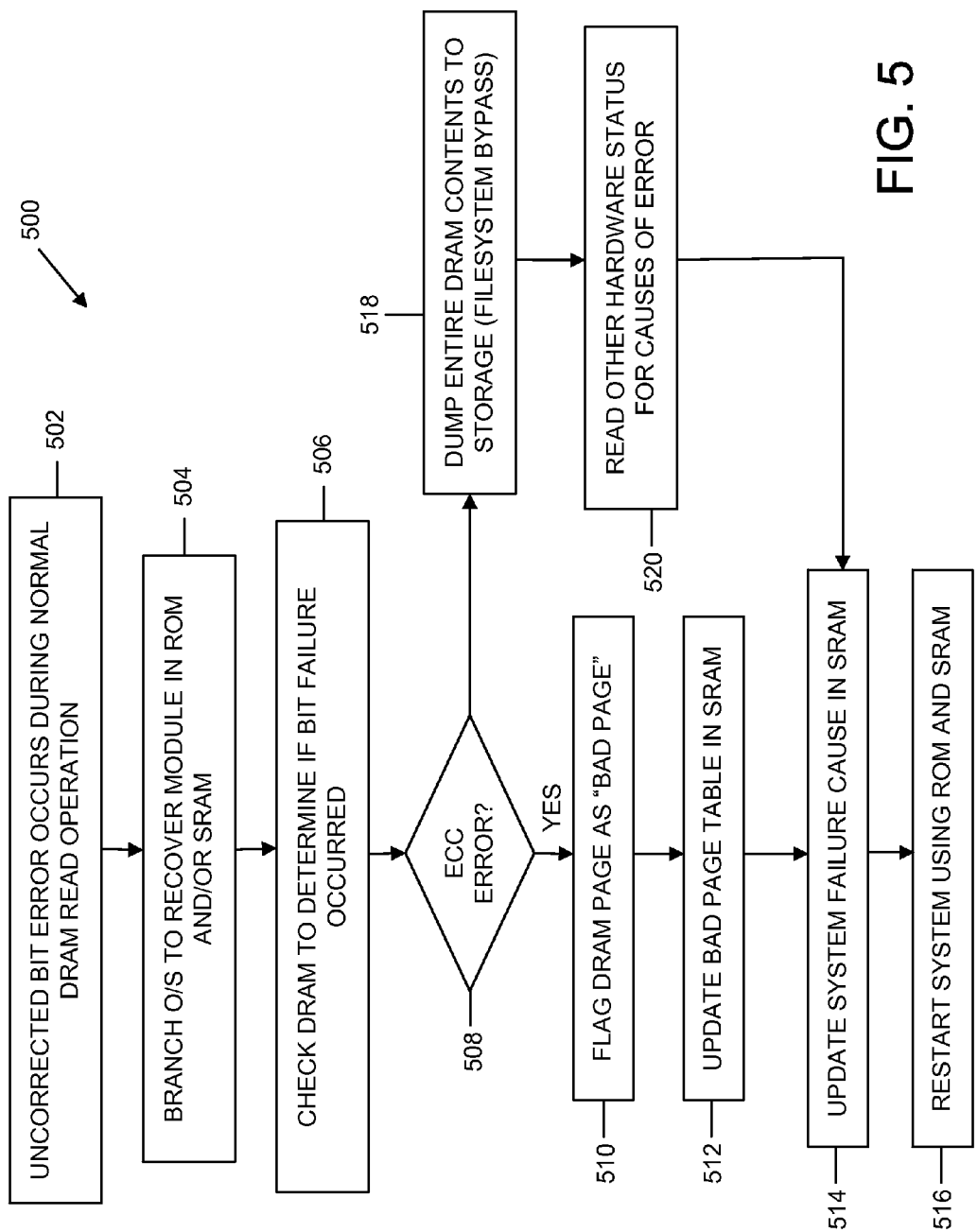
FIG. 5 is a flowchart illustrating another embodiment of a method for recovering from uncorrected DRAM bit errors implemented in the system of FIG. 1.

FIG. 5 illustrates another embodiment of a method 500 implemented in the system 100 for recovering from uncorrected bit errors 123. At block 502, the uncorrected bit error 123 occurs during a normal DRAM read operation. In response to the uncorrected bit error 123, at block 504, the O/S 120 branches to the recover module(s) 115 stored in ROM 112 and/or SRAM 110. At block 506, the recovery module(s) 114 check the DRAM 104 to determine if a bit failure occurred. If the bit failure resulted from ECC error (decision block 508), the corresponding DRAM page 211 is flagged as a bad page (block 510) and the bad pages list 134 stored in SRAM 110 is updated. At block 514, the cause of the system failure may be updated in SRAM 110. At block 516, the system 100 is restarted using ROM 112 and SRAM 110. If the bit failure did not result from ECC error (decision block 508), the contents of DRAM 104 may be dumped to storage (i.e., filesystem bypass) at block 518. At block 520, other hardware status data may be read to determine other causes for the bit failure. If other causes are determined, the system failure may be updated at block 514.

Figure 6:
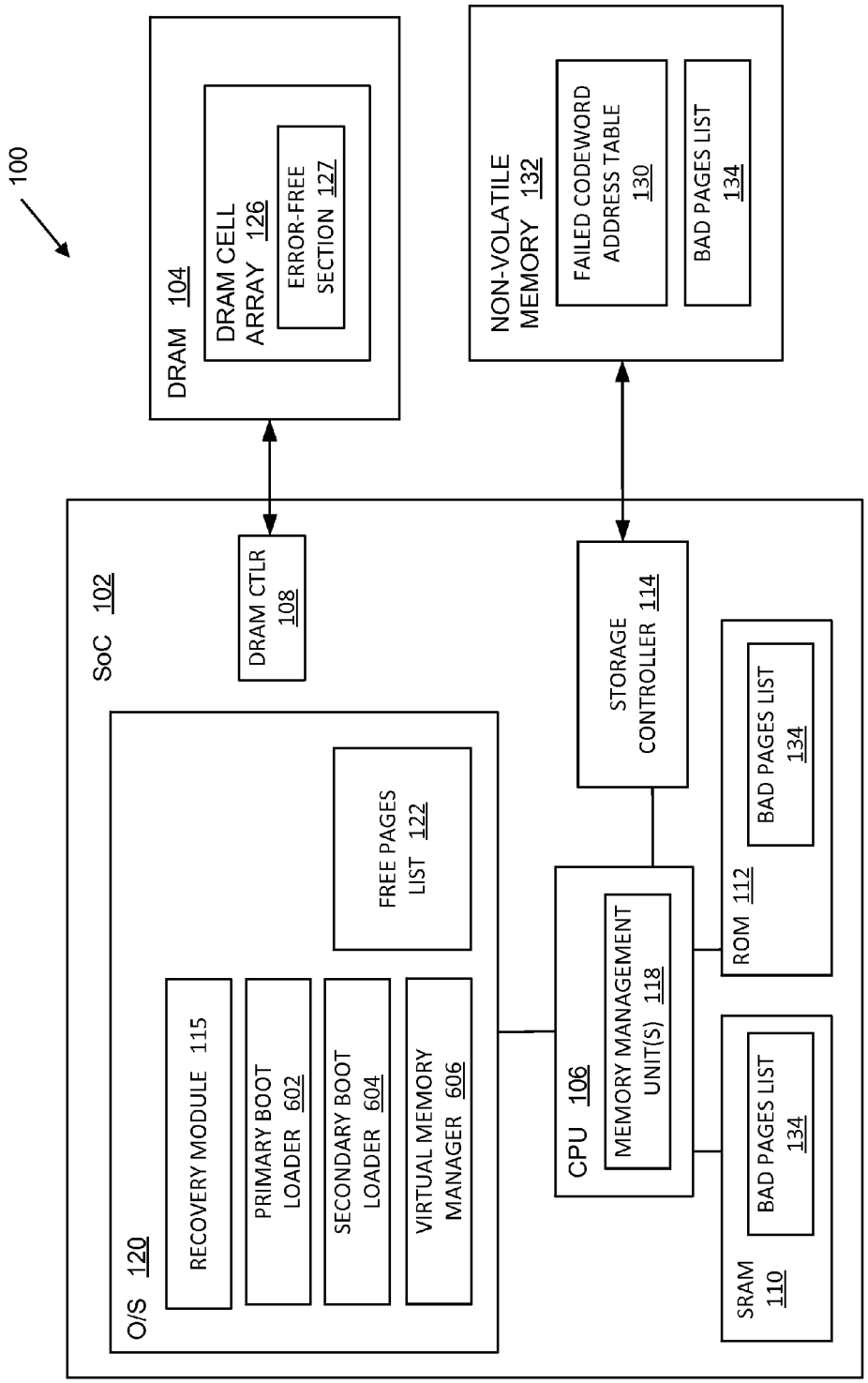
FIG. 6 is a block diagram illustrating another embodiment of a system for recovering from uncorrected DRAM bit errors.
Figure 7:
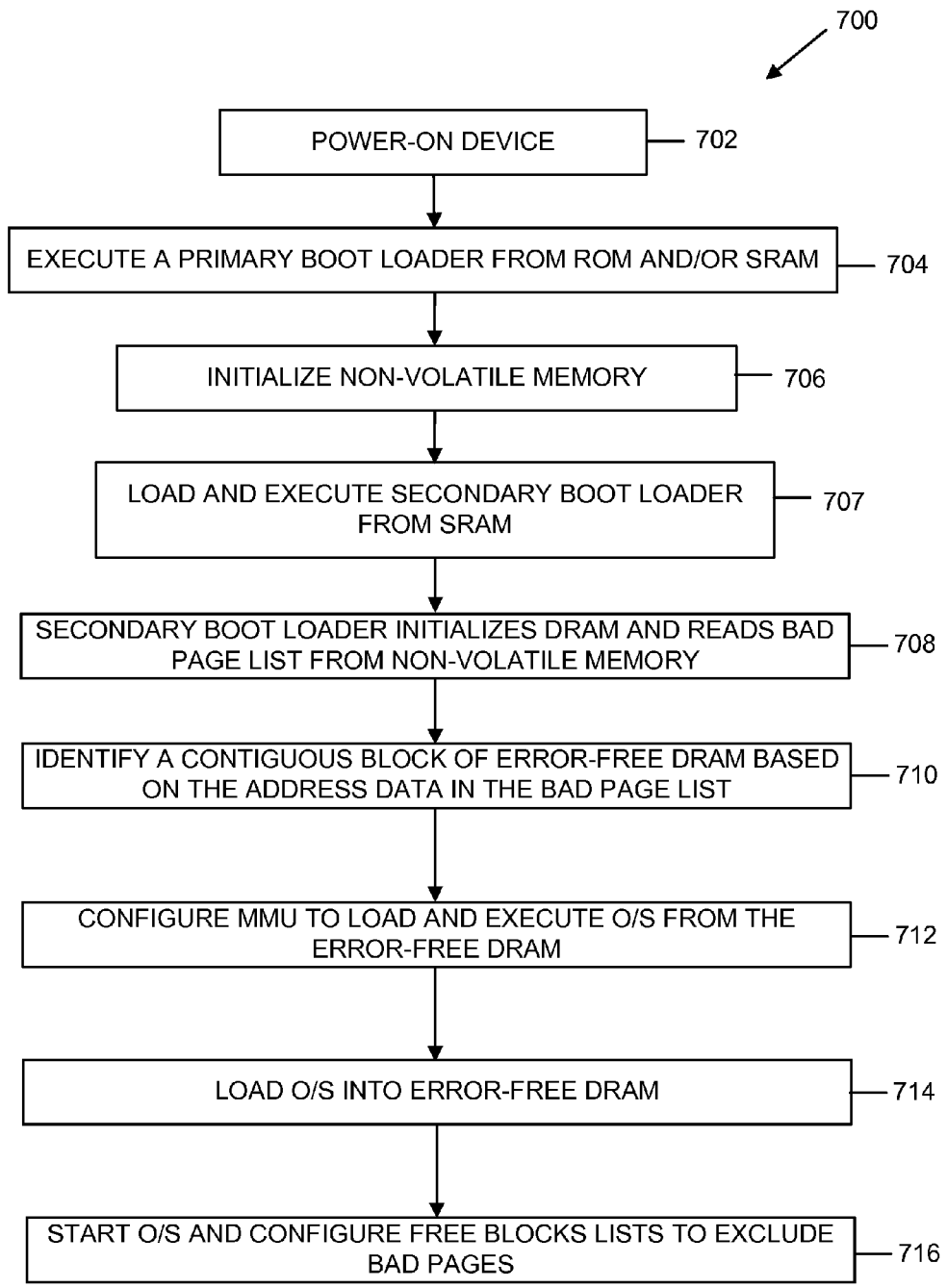
FIG. 7 is a flow chart illustrating an embodiment of a device boot-up method implemented in the system of FIGS. 1 & 6 for recovering from uncorrected DRAM bit errors.

FIGS. 6 & 7 illustrate an exemplary embodiment of a process for rebooting the system 100 in response to the uncorrected bit error 123. As illustrated in FIG. 6, O/S 120 may further comprise a primary boot loader 602, a secondary boot loader 604, and a virtual memory manager 606. Virtual memory manager 606 may comprise a memory allocation component for generating and managing a free page block list 122 for identifying error-free DRAM memory.

Primary boot loader 602 does not execute from or use any DRAM. Rather, it runs from SRAM 110 and/or ROM 112 and loads the secondary boot loader 604 into an unused portion of SRAM 110. Secondary boot loader 604 runs from SRAM 110 and accesses bad pages list 134 and retrieves the list of bad physical pages from non-volatile memory 132. Using the list of bad physical pages, secondary boot loader 604 locates a contiguous section of DRAM addresses (which contain zero bad pages) and configures MMU 118 to use this section as error-free main memory 127 (FIG. 6) for secondary boot operations, such as, for example, loading software mages. The error-free section 127 may be of arbitrary size and may be formed using a single or multiple smaller contiguous sections. The error-free section 127 may be located anywhere in DRAM cell array 126. Alternatively, a predetermined area of DRAM 104 may be guaranteed error free by operating this portion with a high-rate refresh.

Secondary boot loader 604 loads O/S 120 into the error-free section and also passes the bad physical page info along to other system components. O/S 120 starts virtual memory manager 606, which can use the bad physical page data to access the entire memory space. At this point, all bad physical pages have been marked as "don't use" and are never allocated for use. The kernel can relocate to another physical location if needed. All memory clients may communicate with O/S 120 to obtain error-free DRAM.

FIG. 7 illustrates an embodiment of a method 700 for rebooting the system 100 in response to an uncorrected bit error 123. At block 702, a device incorporating system 100 (e.g., PCD 800) is powered on and a boot sequence is initiated. As known in the art, the boot sequence may be initiated by a basic input/output system (BIOS), O/S 120, or CPU 106. At block 704, a primary boot loader 602 is executed by CPU 106 from, for example, ROM 112 and/or SRAM 110. Non-volatile memory 132 is initialized (block 706) and a secondary boot loader 604 is retrieved from non-volatile memory 132 and then loaded and executed from SRAM 110 (block 707). The bad page list 134 is read by the secondary boot loader 604, which will be used to initialize the DRAM 104 (block 708). At block 710, a contiguous block of error-free DRAM is identified based on the address data in bad page list 134. MMU 118 is configured to load and execute secondary boot loader 604 from the error-free section 127 (block 712). At block 714, O/S 120 may be loaded into the error-free section 127. At block 716, O/S 120 starts and configures a free page block list 122 to exclude the bad physical pages identified in bad pages list 134.

As illustrated in FIG. 9, after a bad page has been removed, the system 100 may initiate a process 900 to re-test the failed DRAM page. The test process may be useful in eliminating false negatives. At block 902, the bad pages list 134 is accessed from non-volatile memory 132, SRAM 110, and/or ROM 110 to determine the location of the failed DRAM page 211 to be re-tested. The temperature of the memory may be determined (block 904) and values calculated for a cell retention test (block 906). At block 908, the cell retention test may be performed on the failed DRAM page. One of ordinary skill in the art will appreciate that various tests may be performed. In an embodiment, the cell retention test may involve writing data patterns to the failed DRAM location, then waiting for the charge to leak for a calculated amount of time. Hammer tests may also be performed. As illustrated at decision block 910, if the failed DRAM location passes the cell retention test, the bad page may be restored by deleting the bad page from the bad pages list 134 (block 912) and updating the free blocks list 121 (block 914). If the cell retention test is not passed, other DRAM locations may be tested at block 916.

Figure 8:
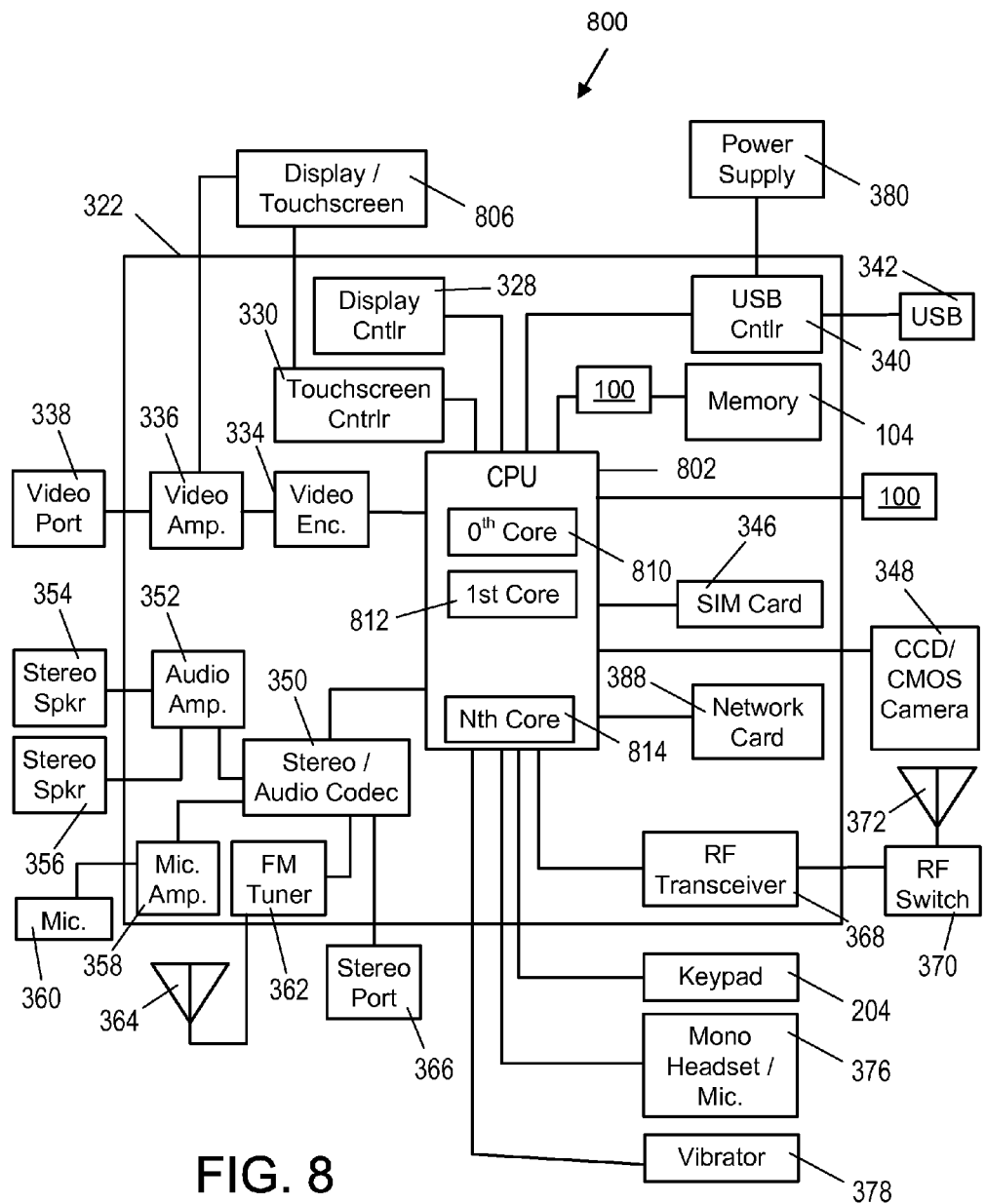
FIG. 8 is a block diagram of an embodiment of a portable computer device comprising the system of FIG. 1.

As mentioned above, the system 100 may be incorporated into any desirable computing system. FIG. 8 illustrates the system 100 incorporated in an exemplary portable computing device (PCD) 800. It may be particularly advantageous to incorporate the system 100 in mobile computing platforms, such as a mobile phone, where DRAM may not be physically accessible and, therefore, not replaceable when the DRAM memory fails. The ability to recover from uncorrected DRAM bit errors may also provide cost advantages by eliminating the need for more costly ECC solutions.

It will be readily appreciated that certain components of the system 100 are included on the SoC 322 (FIG. 8) while other components (e.g., the DRAM 104) are external components coupled to the SoC 322. The SoC 322 may include a multicore CPU 802. The multicore CPU 802 may include a zeroth core 810, a first core 812, and an Nth core 814. One of the cores may comprise, for example, a graphics processing unit (GPU) with one or more of the others comprising the CPU.

A display controller 328 and a touch screen controller 330 may be coupled to the CPU 802. In turn, the touch screen display 806 external to the on-chip system 322 may be coupled to the display controller 328 and the touch screen controller 330.

FIG. 8 further shows that a video encoder 334, e.g., a phase alternating line (PAL) encoder, a sequential color a memoire (SECAM) encoder, or a national television system(s) committee (NTSC) encoder, is coupled to the multicore CPU 602. Further, a video amplifier 336 is coupled to the video encoder 334 and the touch screen display 806. Also, a video port 338 is coupled to the video amplifier 336. As shown in FIG. 8, a universal serial bus (USB) controller 340 is coupled to the multicore CPU 802. Also, a USB port 342 is coupled to the USB controller 340. Memory 104 and a subscriber identity module (SIM) card 346 may also be coupled to the multicore CPU 802. Memory 104 may reside on the SoC 322 or be coupled to the SoC 322 (as illustrated in FIG. 1). The memory 104 may comprise a DRAM memory system (FIG. 1) as described above.

Further, as shown in FIG. 8, a digital camera 348 may be coupled to the multicore CPU 802. In an exemplary aspect, the digital camera 348 is a charge-coupled device (CCD) camera or a complementary metal-oxide semiconductor (CMOS) camera.

As further illustrated in FIG. 8, a stereo audio coder-decoder (CODEC) 350 may be coupled to the multicore CPU 802. Moreover, an audio amplifier 352 may coupled to the stereo audio CODEC 350. In an exemplary aspect, a first stereo speaker 354 and a second stereo speaker 356 are coupled to the audio amplifier 352. FIG. 8 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 8 further illustrates that a radio frequency (RF) transceiver 368 may be coupled to the multicore CPU 802. An RF switch 370 may be coupled to the RF transceiver 368 and an RF antenna 372. A keypad 204 may be coupled to the multicore CPU 802. Also, a mono headset with a microphone 376 may be coupled to the multicore CPU 602. Further, a vibrator device 378 may be coupled to the multicore CPU 802.

FIG. 8 also shows that a power supply 380 may be coupled to the on-chip system 322. In a particular aspect, the power supply 380 is a direct current (DC) power supply that provides power to the various components of the PCD 800 that require power. Further, in a particular aspect, the power supply is a rechargeable DC battery or a DC power supply that is derived from an alternating current (AC) to DC transformer that is connected to an AC power source.

FIG. 8 further indicates that the PCD 800 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 8, the touch screen display 806, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for recovering from dynamic random access memory (DRAM) defects executed by instructions embodied on a non-transitory computer readable medium, the method comprising:
   determining that an uncorrected bit error has occurred for a physical codeword address associated with a dynamic random access memory (DRAM) device coupled to a system on chip (SoC);
   in response to the determination of an uncorrected bit error, branching an operating system to an exception handler running at least one recovery module from one of a static random access memory (SRAM) device and a read only memory (ROM) located on the SoC;
   determining with the recovery module whether a bit failure occurred at the DRAM device as a result of an error correction code (ECC) error; and
   responsive to the determination whether the bit failure occurred as a result of ECC error:
      if the bit failure occurred as a result of ECC error, identifying a kernel page associated with a DRAM page comprising the physical codeword address as a bad page, and
      recovering from the uncorrected bit error by rebooting a system comprising the SoC and the DRAM device and, in response to the rebooting, excluding the identified kernel page from being allocated for DRAM operation, or
      if the bit failure did not occur as a result of ECC error, writing the contents of the DRAM device to a second memory device.

2. The method of claim 1, wherein the determining that the uncorrected bit error has occurred comprises: a DRAM controller receiving a notification from an error correcting code (ECC) module.

3. The method of claim 1, further comprising: in response to the uncorrected bit error, interrupting a central processing unit (CPU) located on the SoC.

4. The method of claim 1, further comprising: in response to the uncorrected bit error, receiving error data corresponding to the physical codeword address.

5. The method of claim 4, wherein the received error data identifies a DRAM bank, column, and row address corresponding to the physical codeword address.

6. The method of claim 1, further comprising: storing the identified kernel page in a bad pages list stored in a memory located on the SoC.

7. The method of claim 6, wherein recovering from the uncorrected bit error by rebooting a system further comprises:
   in response to the rebooting, reading the bad pages list from the memory located on the SoC; and
   configuring a free blocks list that excludes the identified kernel page.

8. The method of claim 1, wherein the SoC and the DRAM device are implemented in a portable communication device and the DRAM device comprises cells having a half-pitch less than 20 nm.

9. The method of claim 1, further comprising:
   performing a cell retention test on the DRAM page; and
   if the DRAM page passes the cell retention test, including the identified kernel page to be allocated for DRAM operation.

10. A system for recovering from memory defects, the system comprising:
   means for determining that an uncorrected bit error has occurred for a physical codeword address associated with a volatile memory device coupled to a system on chip (SoC);
   means responsive to the determination of an uncorrected bit error for branching an operating system to an exception handler running a recovery module from one of a static random access memory (SRAM) device and a read only memory (ROM) located on the SoC;
   means for determining whether a bit failure occurred at the DRAM device as a result of an error correction code (ECC) error; and
   responsive to the determination whether the bit failure occurred as a result of ECC error:
      if the bit failure occurred as a result of ECC error, means for identifying a kernel page associated with a memory page comprising the physical codeword address as a bad page, means for rebooting a system comprising the SoC and the volatile memory device in response to the uncorrected bit error, and means responsive to the rebooting for excluding the identified kernel page from being allocated for memory operation, or if the bit failure did not occur as a result of ECC error, means for writing the contents of the DRAM device to a second memory device.

11. The system of claim 10, wherein the volatile memory device comprise dynamic random access memory (DRAM) and the determining that the uncorrected bit error has occurred comprises: a DRAM controller receiving a notification from an error correcting code (ECC) module.

12. The system of claim 10, further comprising: means responsive to the uncorrected bit error for interrupting a central processing unit (CPU) located on the SoC.

13. The system of claim 10, further comprising: means responsive to the uncorrected bit error for receiving error data corresponding to the physical codeword address.

14. The system of claim 13, wherein the received error data identifies a memory bank, column, and row address corresponding to the physical codeword address.

15. The system of claim 10, further comprising: means for storing the identified kernel page in a bad pages list stored in a memory located on the SoC.

16. The system of claim 15, further comprising:
means responsive to the rebooting for reading the bad pages list from the memory located on the SoC; and
means responsive to the rebooting for configuring a free blocks list that excludes the identified kernel page.

17. The system of claim 10, wherein the SoC and the volatile memory device are implemented in a portable communication device and the volatile memory device comprises cells having a half-pitch less than 20 nm.

18. The system of claim 1, further comprising:
means for performing a cell retention test on the memory page; and
means for including the identified kernel page to be allocated for memory operation if the memory page passes the cell retention test.

19. A computer program embodied on a non-transitory computer readable medium and executable by a processor for recovering from dynamic random access memory (DRAM) defects, the computer program comprising logic configured to:
determine that an uncorrected bit error has occurred for a physical codeword address associated with a dynamic random access memory (DRAM) device coupled to a system on chip (SoC);
in response to the determination of an uncorrected bit error, branch an operating system to an exception handler running at least one recovery module from one of a static random access memory (SRAM) device and a read only memory (ROM) located on the SoC;
determine with the recovery module whether a bit failure occurred at the DRAM device as a result of an error correction code (ECC) error; and
responsive to the determination whether the bit failure occurred as a result of ECC error:
if the bit failure occurred as a result of ECC error, identify a kernel page associated with a DRAM page comprising the physical codeword address as a bad page, and
recover from the uncorrected bit error by rebooting a system comprising the SoC and the DRAM device and, in response to the rebooting, excluding the identified kernel page from being allocated for DRAM operation, or if the bit failure did not occur as a result of ECC error, writing the contents of the DRAM device to a second memory device.

20. The computer program of claim 19, wherein the logic configured to determine that the uncorrected bit error has occurred comprises: logic configured to receive a notification from an error correcting code (ECC) module.

21. The computer program of claim 19, further comprising: logic configured to interrupt a central processing unit (CPU) located on the SoC in response to the uncorrected bit error.

22. The computer program of claim 19, further comprising: logic configured to receive, in response to the uncorrected bit error, error data corresponding to the physical codeword address.

23. The computer program of claim 22, wherein the received error data identifies a DRAM bank, column, and row address corresponding to the physical codeword address.

24. The computer program of claim 19, further comprising: logic configured to store the identified kernel page in a bad pages list stored in a memory located on the SoC.

25. The computer program of claim 24, wherein the logic configured to recover from the uncorrected bit error by rebooting a system further comprises logic configured to:
read the bad pages list from the memory located on the SoC in response to the rebooting; and
configure a free blocks list that excludes the identified kernel page.

26. The computer program of claim 19, wherein the SoC and the DRAM device are implemented in a portable communication device and the DRAM device comprises cells having a half-pitch less than 20 nm.

27. The computer program of claim 19, further comprising:
logic configured to perform a cell retention test on the DRAM page; and
logic configured to include the identified kernel page to be allocated for DRAM operation if the DRAM page passes the cell retention test.

28. A system for recovering from dynamic random access memory (DRAM) defects, the system comprising:
a dynamic random access memory (DRAM) system comprising an error correcting code (ECC) module for detecting and correcting bit errors associated with failed physical codeword addresses in the DRAM system; and
a system on chip (SoC) coupled to the DRAM system, the SoC comprising a DRAM controller, a memory device, and a central processing unit (CPU) for executing a recovery module from the memory device, the recovery module for recovering from an uncorrected bit error that cannot be corrected by the ECC module, the recovery module comprising logic configured to:
determine that the uncorrected bit error has occurred for a physical codeword address associated with the DRAM system;
in response to the determination of an uncorrected bit error, allowing an operating system to branch to an exception handler running the recovery module from one of a static random access memory (SRAM) device and a read only memory (ROM) located on the SoC;

determine with the recovery module whether a bit failure occurred at the DRAM device as a result of an error by the ECC module; and responsive to the determination whether the bit failure occurred as a result of ECC module error:

if the bit failure occurred as a result of ECC module error, identify by the recovery module a kernel page associated with a DRAM page comprising the physical codeword address as a bad page, and initiate a reboot of a system comprising the SoC and the DRAM device and, in response to the reboot, exclude the identified kernel page from being allocated for DRAM operation, or if the bit failure did not occur as a result of ECC module error, write the contents of the DRAM device to a second memory device.

29. The system of claim 28, wherein the logic configured to determine that the uncorrected bit error has occurred comprises: logic configured to receive a notification from the ECC module.

30. The system of claim 28, further comprising: logic configured to interrupt the central processing unit (CPU) in response to the uncorrected bit error.

31. The system of claim 28, further comprising: logic configured to query the ECC module and receive error data corresponding to the physical codeword address.

32. The system of claim 31, wherein the received error data identifies a DRAM bank, column, and row address corresponding to the physical codeword address.

33. The system of claim 28, further comprising: logic configured to store the identified kernel page in a bad pages list in the memory located on the SoC.

34. The system of claim 33, further comprising logic configured to, in response to the reboot:

read the bad pages list from the memory located on the SoC in response to the rebooting; and configure a free blocks list that excludes the identified kernel page.

35. The system of claim 28, wherein the SoC and the DRAM device are implemented in a portable communication device and the DRAM device comprises cells having a half-pitch less than 20 nm.

36. The system of claim 1, wherein the recovery module further comprises logic configured to:

initiate a cell retention test on the DRAM page; and include the identified kernel page to be allocated for DRAM operation if the DRAM page passes the cell retention test.

* * * * *